United States Patent [19]

Tecle

[11] Patent Number: 5,052,612
[45] Date of Patent: Oct. 1, 1991

[54] PROCESS FOR SOLDERING ALLOWING LOW IONIC CONTAMINATION WITHOUT CLEANING OPERATION

[75] Inventor: Berhan Tecle, Wilmington, Del.

[73] Assignee: E. I. Du Pont de Nemours and Company, Wilmington, Del.

[21] Appl. No.: 398,214

[22] Filed: Aug. 24, 1989

[51] Int. Cl.$^5$ .......................... B23K 1/00; H05K 3/34
[52] U.S. Cl. ................................... 228/207; 228/223; 228/259; 148/26
[58] Field of Search ............... 228/207, 223, 224, 180, 228/259; 148/23, 25, 26

[56] References Cited

U.S. PATENT DOCUMENTS 2,671,264 3/1954 Pessel .................................. 228/259

FOREIGN PATENT DOCUMENTS 529290  8/1956  Canada ................................ 228/223
62-16898 1/1987  Japan ................................. 228/223
3093471  4/1988  Japan ................................. 228/223
64-40197 2/1989  Japan ................................. 228/223
1157767  6/1989  Japan ................................. 228/223

*Primary Examiner*—Samuel M. Heinrich

[57] ABSTRACT

A process for soldering a substrate surface which allows low ionic contamination without a cleaning operation which comprises (a) applying a stannous fluoride or eutectic mixture thereof to the substrate surface and (b) applying solder to the flux applied in (a). The stannous fluoride which is relatively inactive below its melting temperature can be applied to the substrate surface and the so treated substrate held for an extended period of time prior to soldering without any harmful effect on the substrate. The process is useful in electronic assembly that would include attachment of components to circuit boards, tinning of circuit boards, pretinning of component leads, connectors etc.

14 Claims, No Drawings

PROCESS FOR SOLDERING ALLOWING LOW IONIC CONTAMINATION WITHOUT CLEANING OPERATION

TECHNICAL FIELD

This invention relates to an improved soldering process. More particularly, this invention relates to an improved soldering process which uses stannous fluoride, which results in low ionic contamination and which requires no separate cleaning operation after soldering. Still more particularly, this invention allows storage of substrates for extented periods of time prior to a soldering operation.

BACKGROUND OF THE INVENTION

In joining metal parts by various known soldering techniques, a soldering flux is often required. This soldering flux performs several functions. First, it promotes the formation of a sound joint by preventing the formation of oxide films during heating and also serves to remove any oxide film already present. In addition to breaking up the oxide films on the surface of the metal, and protecting the fresh metal surface from reoxidation, the soldering flux must be capable of forming a uniform coating of proper thickness on the metal member and also reduce the surface tension of the molten solder, thereby facilitating wetting, flow, and capillarity of the solder over the prepared surface. Another desirable property in a soldering flux is that it must be capable of being readily displaced from the solid metal by the liquid solder without leaving a corrosive residue and without attacking, more than superficially the solid metal. In order to achieve this ready displacement without concurrent deposit of flux residue, the flux should be fluid below soldering temperature, and react at a temperature below the solder's liquidus.

Several reaction salt-type soldering fluxes have been heretofore proposed to obviate these difficulties. For example soldering fluxes containing zinc chloride, ammonium chloride, and an additional alkali metal halide or ammonium halide other than chloride have been used, either in dry form or mixed with a suitable solvent. However, these fluxes have been found to either leave an undesirable corrosive halide residue on the metal surface requiring cleaning with cleaning solvents such as chlorofluorocarbon (CFC) solvents, or have resulted in a roughened surface on the joined members. The soldered joints are also found to have poor corrosion resistance evidenced by the large increase in electrical resistance upon exposure to moist atmospheres.

Japanese 62[1987]-16898 discloses a type of flux for soldering characterized in that it contains stannous fluoride as the activator. The stannous fluoride is used in combination with well known binders such as rosin, rosin phenol, polyethylene glycol, etc. It has been found that metal substrates that have been treated with fluxes containing stannous fluoride and for e.g. rosin have to be used immediately. The rosin forms a tacky coating on the substrate which makes storage of the fluxed metal substrates difficult.

Japanese 64[1989]-40197 discloses a flux consisting of 1-20 weight % of stannous fluoride and the balance of potassium fluoroaluminate complex. The inventor claims use of greater than 20% of the stannous fluoride results in the brazing properties being degraded.

It has been found that using the soldering process of the invention wherein stannous fluoride is used prior to soldering the above disadvantages can be overcome. Metal substrates can be treated and stored without any difficulty until they have to be soldered. Still further, soldering of a metal substrate using stannous fluoride results in a soldered substrate having low ionic contamination and does not require a cleaning operation.

SUMMARY OF THE INVENTION

In accordance with this invention there is provided a process for soldering a substrate surface which allows low ionic contamination without a cleaning operation comprising the steps of
(a) applying a composition consisting of stannous fluoride or eutectic mixture thereof to the substrate surface, and
(b) applying solder to the stannous fluoride or mixture thereof applied in step (a).

DETAILED DESCRIPTION OF THE INVENTION

The soldering process of the invention which uses stannous fluoride or a eutectic mixture thereof results in low ionic contamination without the need for a separate cleaning step. This is important because the best cleaning solvents used to remove ionic contaminants from printed circuit boards after the soldering operation are chlorofluorocarbon (CFC) solvents which are considered to present a threat to the environment because of their involvement in stratospheric ozone depletion.

Residual ionic contamination of substantially no greater than 2 micrograms NaCl equivalent/sq. inch was obtained when stannous fluoride was used in the process of the invention. However, a residual ionic contamination of greater than 2 micrograms NaCl equivalent/sq. inch may be obtained if the solder has components which contribute to ionic contamination or if a process is employed which does not allow sufficient oxidation of the stannous fluoride. Residual ionic contamination was determined using military specification method MIL-P-28809 in an "Omega Meter" 600 (600 ml of 75 weight % isopropyl alcohol and 25 weight % water were used in a 15 minute test).

The soldering process comprises the steps of applying a flux of stannous fluoride or eutectic mixture thereof to a substrate surface followed by the application of solder to the flux treated substrate surface.

Stannous fluoride has a melting point in the range of 210°–219° C. Therefore, it is capable of being fluid below soldering temperature and reacting at a temperature below the solder's liquidus to clean oxides on the surface of the part or substrate to be soldered prior to the soldering operation. Further, stannous fluoride is stable in its molten state and does not chemically decompose and it has the capability for low ionic contamination during the soldering operation. Stannous fluoride is relatively inactive whether as a liquid and particularly as a solid, i.e., it does not have any harmful effect for an extended period of time on conventional substrate surfaces prior to soldering. Therefore, it can be applied to the surface of the substrate to be soldered preserving the substrate's solderability and the substrate can be stored prior to the soldering operation. Using stannous fluoride the effect of corrosion of the soldered portion, degradation of electrical insulating properties, solder dross especially in wave and hot air solder levelling applications, and other adverse effects do not appear at all or are considered to be minimized.

An eutectic mixture of stannous fluoride with small amounts of other inorganic fluoride may be made to lower the melting temperature of the stannous fluoride flux and increase its dwell time during the soldering operation.

The solder may be in the form of a metal or metal alloy powder, a paste, a preform, or it may be in a molten state located in a solder pot. The solder metals may be any of the conventional single or multiphase metals normally used for soldering, including gold, silver, tin, germanium, silicon, antimony, bismuth, lead, indium, gallium, zinc, copper, phosphorous, alloys thereof or mixtures thereof. The solder metal particles are normally smaller than a 100 mesh, and preferably smaller than 200 mesh. When using mixtures of metals or their alloys, by modifying the amount of each it is possible to adjust the melting point, tensile strength, fluidity, shear strength, elongation, Brinell hardness and density, etc., to suit the purpose for which the solder paste is intended. Conventional metal or metal alloy solders used for electronic parts include a 63% Sn-Pb solder, a 55% Sn-Pb solder or a 5% Ag-Pb solder. Other metal or metal alloy solders known to those skilled in the art may also be used.

Stannous fluoride or eutectic mixture thereof may be applied to the surface of the substrate to be soldered using any means known to one skilled in the art, e.g., it may be applied as a thin coating, as a powder coating or as a dispersion. It may be applied to completely cover the substrate surface or it may only be applied to predetermined areas thereof. The treated substrate can then be soldered using conventional solder pastes, solder preforms, and conventional soldering processes, hot air solder levelling or wave soldering processes. Suitable screen or stencil printable solder pastes are disclosed in Conwicke, U.S. Pat. No. 3,684,533 issued Aug. 15, 1982. Printing of the solder paste on fluxed substrate can be by conventional techniques (using screens and stencils). A preferred paste should print through an 80-mesh (or finer) screen, but should not drip between printing operations. Also it should not dry or stiffen excessively when held on the screen for a reasonable period of time. For satisfactory performance the vehicle properties and paste composition should be adjusted to prevent excessive settling out of the powder, but not interfere with the printing operation. The screen printable solder paste composition may be applied to any suitable substrate, particularly metal substrates to form a solder pad. Thereafter, the solder is heated to a temperature where the solder becomes molten and a highly adherent solder bond is formed. Any atmosphere may be used, e.g., air but oxidizing atmospheres are preferred.

Alternately, the stannous fluoride containing compositions may be present as a layer over the solder, for example in a solder pot. This technique prevents oxidation of the solder surface when not in use, and in the soldering operation the stannous fluoride first wets and cleans the surface of the part to be soldered prior to its coming in contact with the molten solder. The thickness of the molten stannous fluoride layer should be such that it permits sufficient fluxing action to obtain good solder wetting. If the stannous fluoride is maintained in the molten state over the molten solder for extended periods of time, a protective layer may be present over the molten stannous fluoride layer to prevent oxidation thereof and enhance the fluxing action of the stannous fluoride. An example of protective layer is oil.

In the soldering operation temperatures in the range of 210° C. to 310° C. are normally used and preferably in the range of 220° C. to 260° C. However the soldering temperature is dependent on the components of the solder material.

Substrates to be soldered are not limited to but include metals, metal clad epoxies, printed circuit boards, metallized ceramics, etc.

INDUSTRIAL APPLICABILITY

The process of the invention is useful in electronic assembly that would include attachment of components to circuit boards, tinning of circuit boards, pre-tinning of component leads, connectors, etc.

As previously mentioned an outstanding advantage in use of stannous fluoride in a solder composition is an ability to eliminate a post cleaning operation such as with a chlorofluorocarbon solvent. Considerable efforts are being made to replace such chlorofluorocarbon solvents due to their environmental impact upon the stratosphere. In addition the failure of cleaning agents to completely remove flux residues from hard to reach, tight spots, and from under components in Surface Mount or Fine Pitch assembly operations, makes current cleaning methods and proposed alternative cleaners less effective. The present invention allows a different solution presently undertaken by the soldering industry which is primarily devoted to replacement of one cleaning agent with another one. The cleaning agents function to reduce ionic contamination resulting from the soldering operation. In contrast the present solder paste formulation imparts low ionic contamination which allows formation of a soldered conductive component with soldered connections such as a printed circuit or printed wiring board (i.e., one containing conductive or non-conductive surface portions) without a need for a cleaning operation prior to assembly of the electronic component in a final electronic device.

The following examples wherein the parts and percentages are by weight illustrate but do not limit the invention.

EXAMPLE 1

Stannous fluoride was heated in an alumina crucible by resistive heating in a reactor assembly. The reactor was evacuated to $10^{-5}$ torr and then kept at positive argon pressure to allow test samples to be dipped in the molten stannous fluoride. Five copper strips were dipped into the molten tin fluoride. Five other copper strips were also made available as controls. All 10 samples were dipped into a solder pot at 288° C. The solder did not wet the control samples while the stannous fluoride coated samples showed excellent wetting and low ionic contamination.

EXAMPLE 2

Copper strips dipped in molten tin fluoride using the same setup as in Example 1 were left to age at ambient conditions for 3 days. After 3 days there was no visible change of the stannous fluoride coating. The 5 samples were dipped into a solder pot at 290° C. All had excellent solder wetting and low ionic contamination.

EXAMPLE 3

Using the same set-up as above, a copper foil, 4 cm$^2$ in size, was positioned 2 cm above the crucible. The foil was left in place until a thin coating was deposited from the vaporized stannous fluoride on the underside of the foil. The foil was removed and carefully dipped into the solder pot at 290° C. The side with the stannous fluoride coating was wetted but the other side did not wet at all.

EXAMPLE 4

An 8 ml capacity crucible filled up to ⅔ of its volume with molten solder was floated on a solder pot kept at 260° C. About 2 g of stannous fluoride were added on top of the molten solder. The fluoride melted and formed a layer. Five copper strips were slowly dipped into the crucible. Both sides of the strips were soldered with excellent wetting.

EXAMPLE 5

Solder powder 40 to 70 micron in size was exposed to a vapor of stannous fluoride in the reactor assembly described above. A tantalum inverted boat source, purchased from R. D. Mathis Co., Long Beach, Calif., was used which provided a downward flow of the vapor. A small tray containing the solder powder was placed on a glasswool support and well positioned for sufficient contact with the vapor. On heating to 260° C., powder treated in this manner coalesced to form a large solder ball while a similar powder remained in its original form with fused powder particles having a thick oxide layer.

EXAMPLE 6

Surface mount pads, 0.025×0.05 inch (0.0635–0.127 cm) in size, were cut from a circuit board. The samples were introduced to an apparatus filled with argon and containing a resistively heated crucible full of stannous fluoride melt. The sample was held for about 15 minutes over the crucible to vapor coat the pads with stannous fluoride. Strips of solder preforms, Solder Quik tape SQ-C-050 from Raychem, Menlo Park, Calif. were cut to the size of the pads. These solder preforms were carefully placed on each pad. The sample was then floated on a solder pot at 280° C. The solder preforms reflowed and completely wetted the entire pad. The process was repeated three times with identical results. Pads which were not coated with stannous fluoride showed poor wetting and the reflowed solder had a rough appearance.

EXAMPLE 7

Ten 2×2 inch (5.08×5.08 cm) copper clad glass epoxy boards, 0.031 inch (0.079 cm) thick, were cleaned by rinsing with spectroscopy grade acetone. A group of 5 of these boards was vapor coated with stannous fluoride in a vacuum and the second group of five boards was used as a control. The stannous fluoride coated boards were placed on a copper foil that was floated on a solder pot which was maintained at a temperature of 250° C. The boards were left on the foil for 90 minutes. Ionic contamination measurements were on both groups of coated and uncoated boards using the Military Specification method MIL-P-28809. Both groups of boards gave identical ionic measurements of 2 micrograms NaCl equivalent/sq. inch which was the lowest measurement obtainable using this method of measurement and measuring device.

What is claimed is:

1. A process of making and assembling an electronic device containing at least one soldered electrically conductive component comprising the steps of:
    (a) applying a composition consisting of stannous fluoride or eutectic mixture thereof to a conductive surface portion of an electrically conductive component,
    (b) applying a solder to the stannous fluoride or mixture to obtain a soldered connection on a substrate surface wherein the ionic contamination on the substrate surface is not greater than 2 micrograms NaCl equivalent/sq. inch,
    (c) assembling the soldered connection into an electronic device in the absence of a solder cleaning operation between steps (b) and (c).

2. The process according to claim 1 wherein the ionic contamination on the substrate after soldering is no greater than 2 micrograms NaCl equivalent/sq inch.

3. The process of claim 1 wherein stannous fluoride is applied.

4. The process according to claim 3 wherein the stannous fluoride is applied as a thin coating.

5. The process according to claim 3 wherein the stannous fluoride is applied as a powder coating.

6. The process according to claim 1 which further comprises the step of:
    (c) heating to melt the solder.

7. The process according to claim 6 wherein heating to melt the solder occurs simultaneously with step (b).

8. The process according to claim 7 wherein heating to melt the solder occurs after step (b).

9. The process according to claim 2 wherein the the solder is a metal or metal alloy.

10. The process according to claim 9 wherein the metal or metal alloy is selected from the group consisting essentially of gold, silver, tin, germanium, silicon, antimony, bismuth, lead, indium, gallium, zinc, copper, phosphorous, and alloys or mixtures thereof.

11. The process according to claim 10 wherein the metal or metal alloy is 36% lead, 62% tin, and 2% silver.

12. A process for soldering a surface which allows low ionic contamination without a cleaning operation comprising the steps of:
    (a) forming a molten bath containing two discrete sections with molten solder having a surface liquid layer consisting of stannous fluoride or eutectic mixture thereof,
    (b) applying a surface which is to be soldered into the molten bath wherein the surface passes through the stannous fluoride or mixture thereof prior to contact with the molten solder to obtain a soldered connection on a substrate surface wherein the ionic contamination on the substrate surface is not greater than 2 micrograms NaCl equivalent/sq. inch,
    (c) assembling the soldered connection into an electronic device in the absence of a solder cleaning operation between steps (b) and (c).

13. The process of claim 12 wherein a protective layer is present in the stannous fluoride or mixture.

14. The process of claim 12 wherein the protective layer is an oil.

* * * * *